(12) United States Patent
Kim et al.

(10) Patent No.: US 9,560,745 B2
(45) Date of Patent: Jan. 31, 2017

(54) DEVICES AND METHODS TO REDUCE STRESS IN AN ELECTRONIC DEVICE

(71) Applicant: QUALCOMM Incorporated, San Diego, CA (US)

(72) Inventors: Daeik Daniel Kim, San Diego, CA (US); Je-Hsiung Jeffrey Lan, San Diego, CA (US); Changhan Hobie Yun, San Diego, CA (US); Mario Francisco Velez, San Diego, CA (US); Chengjie Zuo, Santee, CA (US); Jonghae Kim, San Diego, CA (US); David Francis Berdy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/498,230

(22) Filed: Sep. 26, 2014

(65) Prior Publication Data

US 2016/0095208 A1 Mar. 31, 2016

(51) Int. Cl.
| | |
|---|---|
| H01L 21/768 | (2006.01) |
| H05K 1/02 | (2006.01) |
| C23F 1/02 | (2006.01) |
| H05K 1/03 | (2006.01) |
| H05K 1/09 | (2006.01) |
| H01L 23/00 | (2006.01) |

(52) U.S. Cl.
CPC ............... *H05K 1/0271* (2013.01); *C23F 1/02* (2013.01); *H01L 21/768* (2013.01); *H01L 23/562* (2013.01); *H05K 1/0306* (2013.01); *H05K 1/09* (2013.01); *H01L 2924/0002* (2013.01); *H05K 2201/0154* (2013.01); *H05K 2201/0195* (2013.01)

(58) Field of Classification Search
None
See application file for complete search history.

(56) References Cited

U.S. PATENT DOCUMENTS

| | | | |
|---|---|---|---|
| 7,776,739 B2 | 8/2010 | Cestra et al. | |
| 7,939,370 B1 | 5/2011 | Lu et al. | |
| 8,497,583 B2 | 7/2013 | Chumakov et al. | |
| 8,508,053 B2 | 8/2013 | Chumakov | |
| 2001/0001550 A1 | 5/2001 | Bryzek et al. | |
| 2008/0083976 A1* | 4/2008 | Haba | H01L 23/481 257/686 |
| 2010/0327280 A1* | 12/2010 | Joseph | G06F 17/5009 257/51 |
| 2013/0292793 A1* | 11/2013 | Poucher | H01L 29/0649 257/522 |

FOREIGN PATENT DOCUMENTS

WO 2010022970 3/2010

OTHER PUBLICATIONS

International Search Report and Written Opinion for International Application No. PCT/US2015/048597, ISA/EPO, Date of Mailing Nov. 6, 2015, 9 pages.

* cited by examiner

*Primary Examiner* — Charles Garber
*Assistant Examiner* — Steven Christopher
(74) *Attorney, Agent, or Firm* — Toler Law Group, PC

(57) ABSTRACT

A device includes a stress relief region between at least two stress domains of a substrate (e.g., of a semiconductor die or other integrated circuit). The stress relief region includes a conductive structure electrically coupling circuitries of the stress domains between which the conductive structure is disposed.

30 Claims, 7 Drawing Sheets

DEVICES AND METHODS TO REDUCE STRESS IN AN ELECTRONIC DEVICE

I. FIELD

The disclosure is generally related to reducing stress in an electronic device.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, may communicate voice and data packets over wireless networks. Further, many such wireless telephones include other types of devices that are incorporated therein. For example, a wireless telephone may also include a digital still camera, a digital video camera, a digital recorder, and an audio file player. Also, such wireless telephones may process executable instructions, including software applications, such as a web browser application, that may be used to access the Internet. As such, these wireless telephones may include significant computing capabilities.

Electronic devices may include passive components (e.g., integrated passive devices (IPD)). The IPDs may include metal layers (e.g., copper layers) and dielectric layers (e.g., polyimide layers). A large difference in coefficients of thermal expansion (CTE) between the metal layers, the dielectric layers, and/or a substrate, may add stress to the IPD, causing the IPD to warp (e.g., deform, bend, twist, etc.).

III. SUMMARY

Intra-device (e.g., intra-die) stress relief regions are introduced to reduce warpage associated with thermally-induced mechanical stress related to heating and cooling of layers of a device (e.g., a semiconductor die or other integrated circuit) that have mismatched coefficients of thermal expansion (CTE). The stress relief regions may be located between portions (e.g., "stress domains") of a substrate (e.g., of the semiconductor die or other integrated circuit), where each of the stress domains includes corresponding circuitry. Layers of the stress relief region may not exhibit as much CTE mismatch as layers of the circuitry, allowing the stress relief region to reduce stress between stress domains of the substrate. A conductive structure within a portion of the stress relief region electrically couples circuitries of different stress domains to enable electrical signals to be communicated between the circuitries.

In a particular embodiment, a device includes a first circuitry associated with (e.g., of, within, or formed on) a first stress domain of a substrate (e.g., of a semiconductor die or other integrated circuit) and a second circuitry associated with a second stress domain of the substrate (e.g., of the semiconductor die or other integrated circuit). The device includes a stress relief region between the first and second stress domains. The stress relief region includes a conductive structure electrically coupling the first circuitry to the second circuitry.

In another particular embodiment, a method includes forming first circuitry associated with a first stress domain of a substrate (e.g., of a semiconductor die or other integrated circuit) and second circuitry associated with a second stress domain of the substrate (e.g., of the semiconductor die or other integrated circuit). The method includes forming a stress relief region between the first circuitry and the second circuitry. The method further includes forming a conductive structure within the stress relief region. The conductive structure electrically couples the first circuitry to the second circuitry.

In another particular embodiment, a device includes first means for conducting associated with a first stress domain of a substrate (e.g., of a semiconductor die or other integrated circuit). The first means for conducting may include a first circuitry. The device includes second means for conducting within a second stress domain of the substrate (e.g., of the semiconductor die or other integrated circuit). The second means for conducting may include a second circuitry. The device includes means for relieving stress between the first means for conducting and the second means for conducting. The means for relieving stress includes a conductive structure electrically coupling the first means for conducting and the second means for conducting.

In another particular embodiment, a method includes receiving a data file including design information corresponding to an integrated device. The method includes fabricating the device according to the design information. The integrated device includes first circuitry associated with a first stress domain of a substrate (e.g., of a semiconductor die or other integrated circuit), second circuitry associated with a second stress domain of the substrate (e.g., of the semiconductor die or other integrated circuit), and a stress relief region between the first stress domain and the second stress domain. The stress relief region includes a conductive structure electrically coupling the first circuitry to the second circuitry.

One particular advantage provided by at least one of the disclosed embodiments is that an amount of stress in a device that is caused by CTE mismatch may be reduced as compared to devices that do not incorporate intra-device stress relief regions. For example, the stress relief regions may reduce an amount of stress applied to a device and a wafer from which the device is generated. Reducing the amount of stress, and thus reducing the amount of warpage, may improve processing efficiency and improve the testability of the device. Reducing the amount of stress may also improve the radio frequency performance of an electronic device that includes the device.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Particular embodiments of devices (e.g., semiconductor dies or other integrated circuits) that include a substrate and an intra-device (e.g., an intra-die) stress relief region between stress domains of the substrate are presented in this disclosure. The devices may include an integrated passive device (IPD) and/or a wafer level chip scale package (WLCSP). It should be appreciated, however, that the concepts and insights used in the particular embodiments may be embodied in a variety of contexts. The particular embodiments presented are merely illustrative, and do not limit the scope of this disclosure.

Heating and cooling device layers (e.g., metallization and dielectric layers) that have different coefficients of thermal expansion (CTE) than the substrate (e.g., a wafer or a panel) may produce thermally-induced mechanical stress. For example, during thin film deposition, wafer warpage may occur due to the CTE mismatch of the different thin films and the substrate.

Figure 1:
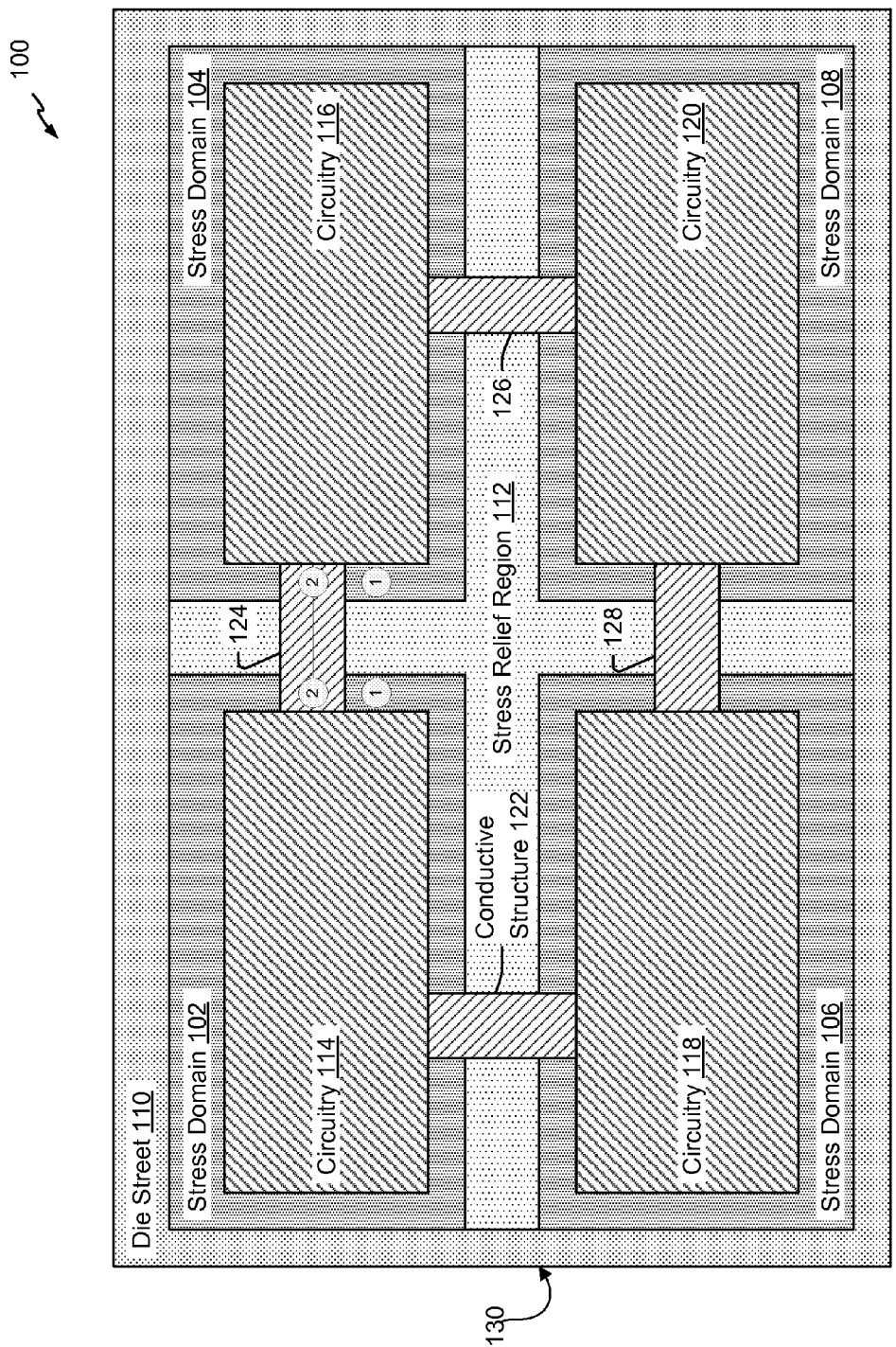
FIG. 1 is a top view of a diagram of a particular embodiment of a device that includes one or more stress relief regions to relieve stress.

Referring to FIG. 1, a top view of a particular embodiment of a device (e.g., a semiconductor die or other integrated circuit) 100 that includes a substrate 130 and a stress relief region between stress domains of the substrate 130 and a conductive structure connecting circuitries of the stress domains is shown.

As shown in FIG. 1, the substrate 130 may include a first stress domain (e.g., stress domain 102) and a second stress domain (e.g., stress domain 104). In some embodiments, the device 100 may include other stress domains. For example, as shown in FIG. 1, in some embodiments, the substrate 130 may include a third stress domain 106 and a fourth stress domain 108. A stress domain is a region or zone of the substrate 130 that experiences mechanical stress associated with heating and cooling of device layers (e.g., metallization layers and dielectric layers) that have different coefficients of thermal expansion (CTE) than the substrate 130.

As shown in FIG. 1, the device 100 includes first circuitry (e.g., circuitry 114) associated with the first stress domain 102 and second circuitry (e.g., circuitry 116) associated with the second stress domain 104. In some embodiments, the device 100 may include other circuitries associated with other stress domains. For example, in some embodiments, the device 100 may include a third circuitry (e.g., circuitry 118) associated with the third stress domain 106 and a fourth circuitry (e.g., circuitry 120) associated with the fourth stress domain 108. For example, in FIG. 1, the first circuitry 114 may be associated with the first stress domain 102 and the second circuitry 116 may be associated with the second stress domain 104. The first circuitry 114 and the second circuitry 116 may include one or more metallization layers, a top dielectric layer, and one or more intermediate dielectric layers (IDLs). Other circuitries (e.g., the third circuitry 118 and the fourth circuitry 120) of the device 100 may include one or more metallization layers, a top dielectric layer, and one or more intermediate dielectric layers (IDLs). The one or more intermediate dielectric layers may be disposed between the one or more metallization layers and may be configured to insulate the one or more metallization layers.

The top dielectric layer and the one or more intermediate dielectric layers may include any insulating material, such as a polyimide. The one or more metallization layers may include any conductive metal, such as copper (Cu). The one or more metallization layers may be configured to conduct electrical signals. The one or more metallization layers may be relatively thin (e.g., less than or equal to 50 micrometers thick). The dielectric layers may be cured at high temperatures, and may contract differently than the metallization layers due to a difference in CTE of the metallization layers and the dielectric layers. As a result, mechanical stress may arise between the metallization layers and the dielectric layers upon cooling after curing.

In some embodiments, film deposition processes, such as chemical vapor deposition (CVD), physical vapor deposition (PVD) (e.g., sputtering or evaporation), and/or electroplating may be used to form metal layers and inter-metal dielectric layers. Photolithography may be used to form patterns of metal layers. An etching process may be performed to remove unwanted materials. Planarization processes, such as "etch-back" and chemical-mechanical polishing (CMP), may be employed to create a flat surface.

The device 100 may include a dicing street 110. The dicing street 110 may be formed of the substrate 130. The first circuitry 114, second circuitry 116, third circuitry 118, and/or fourth circuitry 120 may be formed on the substrate 130. The substrate 130 may be made of a low-loss material. For example, the substrate 130 may be a dielectric or a wide-bandgap semiconductor (e.g., glass, polymer, and/or combinations or laminates thereof). The low-loss material may include a highly-insulative material. In a particular embodiment, the device 100 includes an IPD and the substrate 130 includes a glass-type substrate. In another particular embodiment, the substrate 130 includes a silicon-type substrate. In yet another particular embodiment, the substrate 130 may include a silicon-on-insulator (SOI) substrate, a silicon-on-sapphire (SOS) substrate, a high resistivity substrate (HRS), or a silicon carbide (SiC) substrate, as illustrative, non-limiting examples. The substrate 130 may be less than or equal to 700 micrometers thick. The substrate 130 may be less than or equal to 500 micrometers thick.

The device 100 may include a stress relief region 112 located between one or more of the stress domains 102, 104, 106, and/or 108. For example, the stress relief region 112 may be located between the first stress domain 102 and the third stress domain 106, between the first stress domain 102 and the fourth stress domain 108, between the second stress domain 104 and the third stress domain 106, between the second stress domain 104 and the fourth stress domain 108, and/or between the third stress domain 106 and the fourth stress domain 108. The stress relief region 112 may be formed by removing at least a portion of at least one dielectric layer of stress domains between which the stress relief region 112 is disposed. For example, a portion of at least one dielectric layer included in the first stress domain 102 and/or the second stress domain 104 may be removed from a portion of the stress relief region 112 between the first stress domain 102 and the second stress domain 104. A dielectric layer may be removed from the stress relief region 112 using an etching process. The stress relief region 112 may include fewer layers than each of the first stress domain 102 and the second stress domain 104 to reduce inter-domain stress between the first stress domain 102 and the second stress domain 104.

One or more conductive structures (e.g., stress mitigation structures (SMS)) may be formed in the stress relief region 112 between adjacent stress domains. Each SMS may electrically couple one or more of the circuitries of the stress domains between which the SMS is positioned so that electrical signals may be communicated between the circuitries. For example, the stress relief region 112 may include a first SMS 124 electrically coupling the first circuitry 114 of the first stress domain 102 to the second circuitry 116 of the second stress domain 104, a second SMS 122 electrically coupling the first circuitry 114 of the first stress domain 102 to the third circuitry 118 of the third stress domain 106, a third SMS 126 electrically coupling the second circuitry 116 of the second stress domain 104 to the fourth circuitry 120 of the fourth stress domain 108, and/or a fourth SMS 128 electrically coupling the third circuitry 118 of the third stress domain 106 to the fourth circuitry 120 of the fourth stress domain 108. Each of the SMSs 122, 124, 126, and/or 128 may include a same or different number of IDLs as stress domains between which the SMS is disposed. One or more of the SMSs 122, 124, 126, and/or 128 may include aluminum, copper, or a combination thereof. The structure and materials of the SMSs is further described with reference to FIGS. 3 and 4. One or more of the SMSs illustrated in FIG. 1 may include a bend between a first portion of the conductive structure and a second portion of the SMS, as described in further detail with reference to FIG. 4.

Though FIG. 1 illustrates the device 100 as having four stress domains and associated circuitries, the device 100 may include a different number (e.g., more or less than four) of stress domains. Additionally, the stress relief region, stress domains, and/or circuitries of the device 100 may have different shapes/geometries than those illustrated in FIG. 1. Also, the stress domains and/or circuitries of the device 100 may be arranged differently than the arrangement illustrated in FIG. 1. Furthermore, the device 100 may include multiple stress relief regions (e.g., depending on the arrangement of the stress domains and/or circuitries). A person of skill in the art will recognize that the device 100 is not limited to any particular dicing geometries, particular number of stress domains, particular stress domain geometries, particular number of circuitries, particular circuitry layers, particular circuitry geometries, particular stress domain arrangements, particular circuitry arrangements, and/or particular number of stress relief regions. For example, an apparatus may include a die that includes multiple (e.g., discontinuous) stress relief regions, more or less than four stress domains, one or more non-rectangular stress domains, and/or non-uniform stress domain and circuitry geometries.

FIG. 1 thus illustrates the device 100 including one or more circuitries (e.g., the circuitries 114, 116, 118, and 120) of corresponding stress domains (e.g., the stress domains 102, 104, 106, 108), a stress relief region 112 between one or more of the stress domains 102, 104, 106, and/or 108, and one or more conductive structures (e.g., the SMSs 122, 124, 126) within at least a portion of the stress relief region 112. The device 100 (e.g., the stress relief regions and/or the SMSs) may reduce intra-device (e.g., intra-die) stress while enabling electrical signals to pass from circuitry to circuitry within the device 100.

Figure 2:
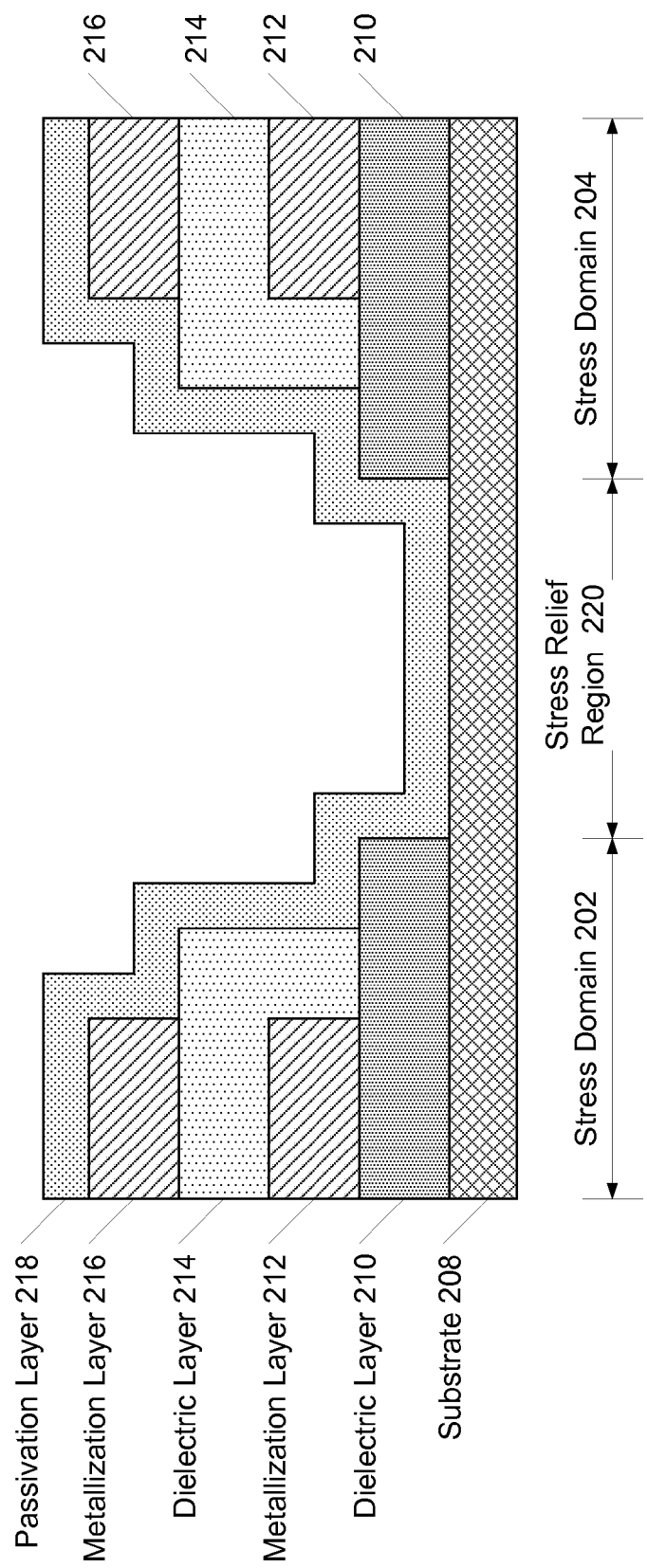
FIG. 2 is a cross-sectional view of a portion of a device taken along a section 1-1 of FIG. 1.

Referring to FIG. 2, a cross-sectional view of a stress relief region taken along a section 1-1 of the device 100 of FIG. 1 is shown. A first stress domain 202 and a second stress domain 206 may correspond to the stress domains 102 and 104, the stress domains 102 and 106, the stress domains 106 and 108, and/or the stress domains 104 and 108, of FIG. 1.

The first stress domain 202 includes a first circuitry that includes one or more dielectric layers (e.g., 210, 214, and 218), and one or more metallization layers (e.g., metallization layers 212 and 216). The first circuitry and the second circuitry may be formed on the substrate 208. The substrate 208 may correspond to the substrate 130 of FIG. 1. The first circuitry of the first stress domain 202 may correspond to the first circuitry 114 of FIG. 1. The second stress domain 206 includes second circuitry that includes one or more dielectric layers (e.g., 210, 214, and 218), and one or more metallization layers (e.g., metallization layers 212 and 216). The second circuitry of the second stress domain 206 may correspond to the second circuitry 116 of FIG. 1. The one or more metallization layers 210, 214, and 218 may be configured to conduct electrical signals. One or more of the one or more metallization layers 210, 214, and 218 may be less than or equal to 50 micrometers thick. The dielectric layers 210, 214, and 218 may be configured to insulate the one or more metal layers 212 and 216. The dielectric layer 218 may be a top dielectric layer, and the dielectric layers 210 and 214 may be interlayer dielectric layers (IDLs). The one or more IDLs 210 and 214 may be disposed between the one or more metal layers 212 and 216. One or more of the dielectric layers 210, 214, and 218 may be less than or equal to 15 micrometers thick. The top dielectric layer 218 and the one or more IDLs 210 and 214 may include any insulating material, such as, for example, polyimide. The one or more metallization layers 212 and 216 may include any conductive metal, such as, for example, copper. The substrate 208 may correspond to the substrate 130 of FIG. 1.

The stress relief region 220 may correspond to a portion of the stress relief region 112 of FIG. 1 that does not include a conductive structure. The stress relief region 220 may include fewer layers than the number of layers of the first stress domain 202 and/or the second stress domain 204 to reduce inter-domain stress between the first stress domain 202 and the second stress domain 204. In some embodiments, at least a first portion of the one or more dielectric layers 210 and 214 is positioned in the first stress domain 202 and at least a second portion of the one or more dielectric layers 210 and 214 is positioned in the second stress domain 204. In some embodiments, the stress relief region 220 does not include one or more of the one or more dielectric layers 210 and 214. In some embodiments, the one or more dielectric layers 210 and 214 may include a polyimide layer. In some embodiments, the stress relief region 220 does not include the one or more IDLs 210 and 214 and/or the metallization layers 212 and 216. In some embodiments, the stress relief region 220 may include only the top dielectric layer 218. In some embodiments, the top dielectric layer 218 is a passivation layer and is included in the first stress domain 202, the second stress domain 204, and the stress relief region 220.

Stress resulting from different thermal expansion of multilayers of the stress domains 202 and 204 may be released into the stress relief region 220. Thus, warpage of the device 100 of FIG. 1 may be significantly reduced.

Figure 3:
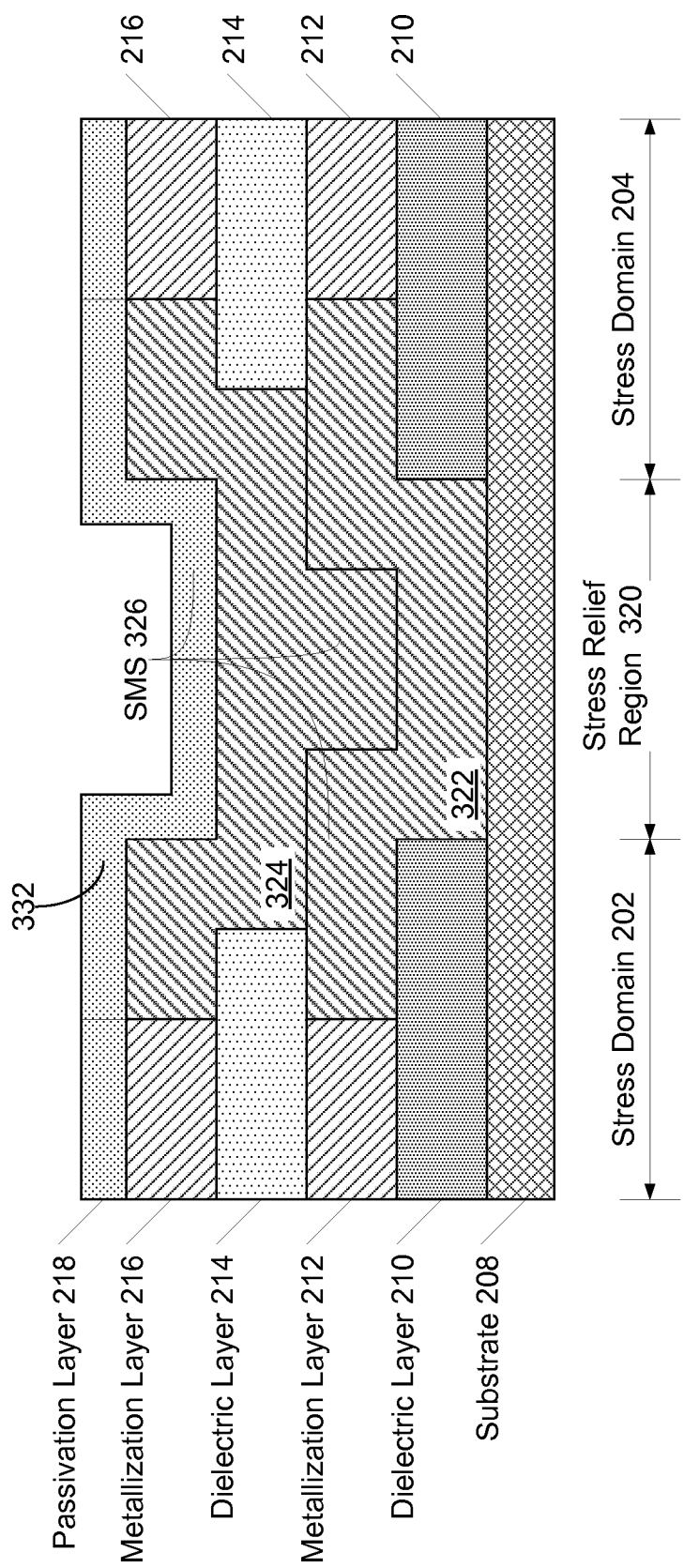
FIG. 3 is a cross-sectional view of a portion of a device taken along a section 2-2 of FIG. 1.

Referring to FIG. 3, a cross-sectional view of a region of the device 100 of FIG. 1 including a SMS 326 within a stress relief region 320 is shown. The SMS 326 of FIG. 3 may correspond to the conductive structures 122, 124, 126, and 128 of FIG. 1. The SMS 326 may include one or more metallization layers (e.g., metallization layers 322 and 324) and the passivation layer 332 over the metallization layer 324. The one or more metallization layers 322 and 324 may interconnect one or more metallization layers 212 and 216 of the first stress domain 202 and the second stress domain 204.

For example, the metallization layer 322 of the SMS 326 may electrically couple the metallization layer 212 of the first stress domain 202 to the metallization layer 212 of the second stress domain 204. As another example, the metallization layer 324 of the SMS 326 may electrically interconnect the metallization layer 216 of the first stress domain 202 and the metallization layer 216 of the second stress domain 304. The top dielectric layer 218 may be the same material as the top dielectric layer 218 of the first stress domain 202 and the top dielectric layer 218 of the second stress domain 204.

Figure 4:
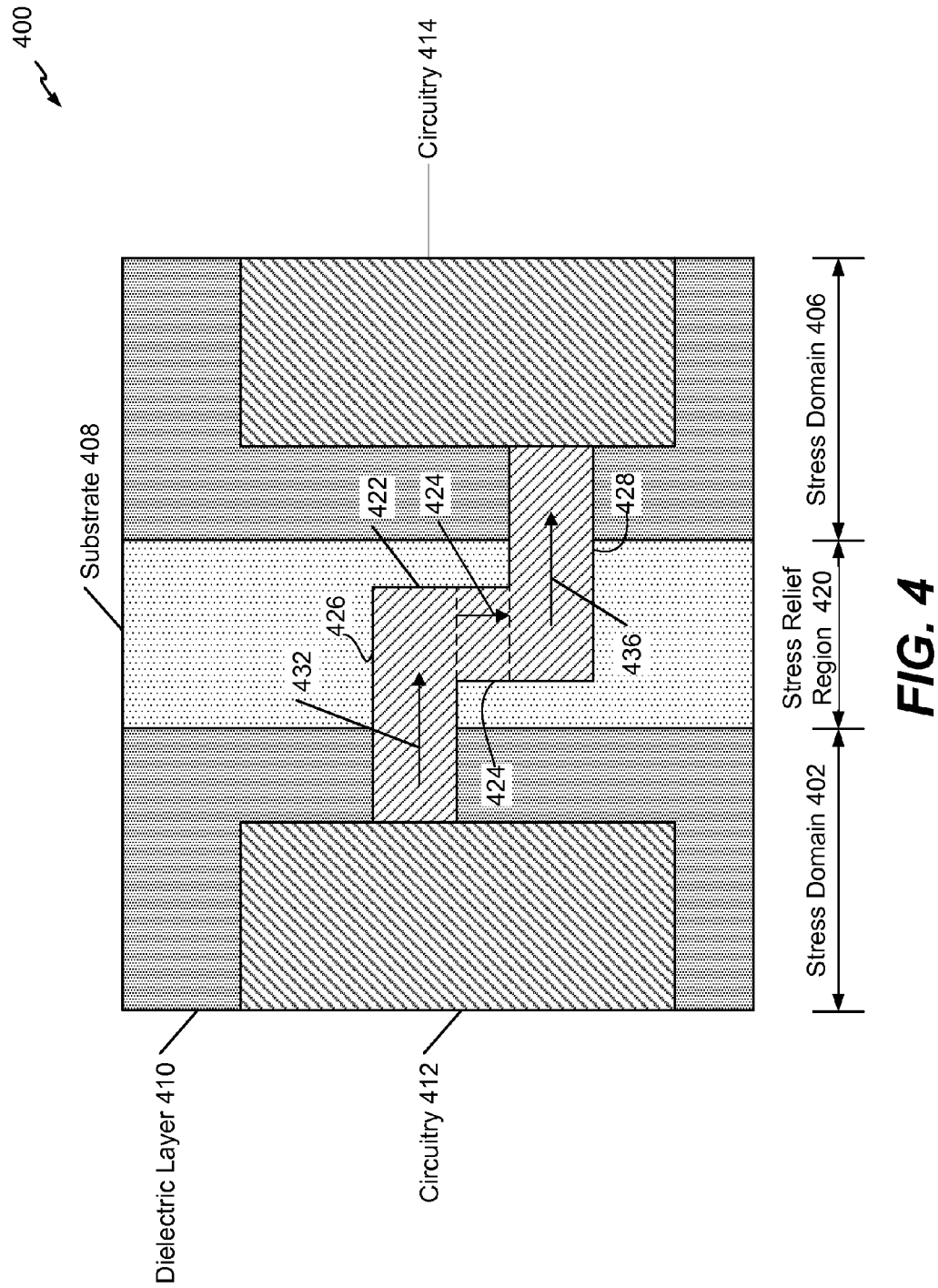
FIG. 4 is a diagram of a particular embodiment of a stress mitigation structure (SMS) that includes a bend between a first portion of the SMS and a second portion of the SMS.

Referring to FIG. 4, a top view of a portion of a device 400 including a first circuitry 412 of a first stress domain 402, second circuitry 414 of a second stress domain 406, a stress relief region 420 between the first and second stress domains, and a conductive structure (e.g., an SMS) 422 within the stress relief region 420 having a bend between a first portion and a second portion is shown. The first circuitry 412 and the second circuitry 414 may correspond to the first circuitry 114 and the second circuitry 116, respectively, of FIG. 1. The first stress domain 402 and the second stress domain 406 may correspond, respectively, to the first stress domain 102 and the second stress domain 104 of FIG. 1. The stress relief region 420 may correspond to the stress relief region 112 of FIG. 1. The SMS 422 may correspond to any one or more of the SMSs 122, 124, 126, and/or 128 respectively, of FIG. 1.

In FIG. 4, the SMS 422 may include a material stack layered according to the stack of SMS 326 as described above. The SMS 422 includes a bend portion 424 between a first portion 426 and a second portion 428. A direction of stress in the bend portion 424 may be different than a direction of stress in the first portion 426 and/or the second portion 428. For example, a direction of stress in the bend portion 424 may correspond to the direction of arrow 434, while a direction of stress in the first portion 426 and the second portion 428 may correspond to the direction of arrows 432 and 436, respectively. The intersection of the bend portion 424 and the first and second portions 426 and 428 may form bends (e.g., corners). The bends and bend portion 424 of the SMS 422 may relieve stress by preventing stress from the first stress domain 402 from being directly applied to the second stress domain 406 and/or vice versa. Though angular bends are illustrated, curved bends may also, or alternatively, be implemented. Though the SMS 422 is illustrated as including a single bend portion, an SMS may include more than one bend portion.

Figure 5:
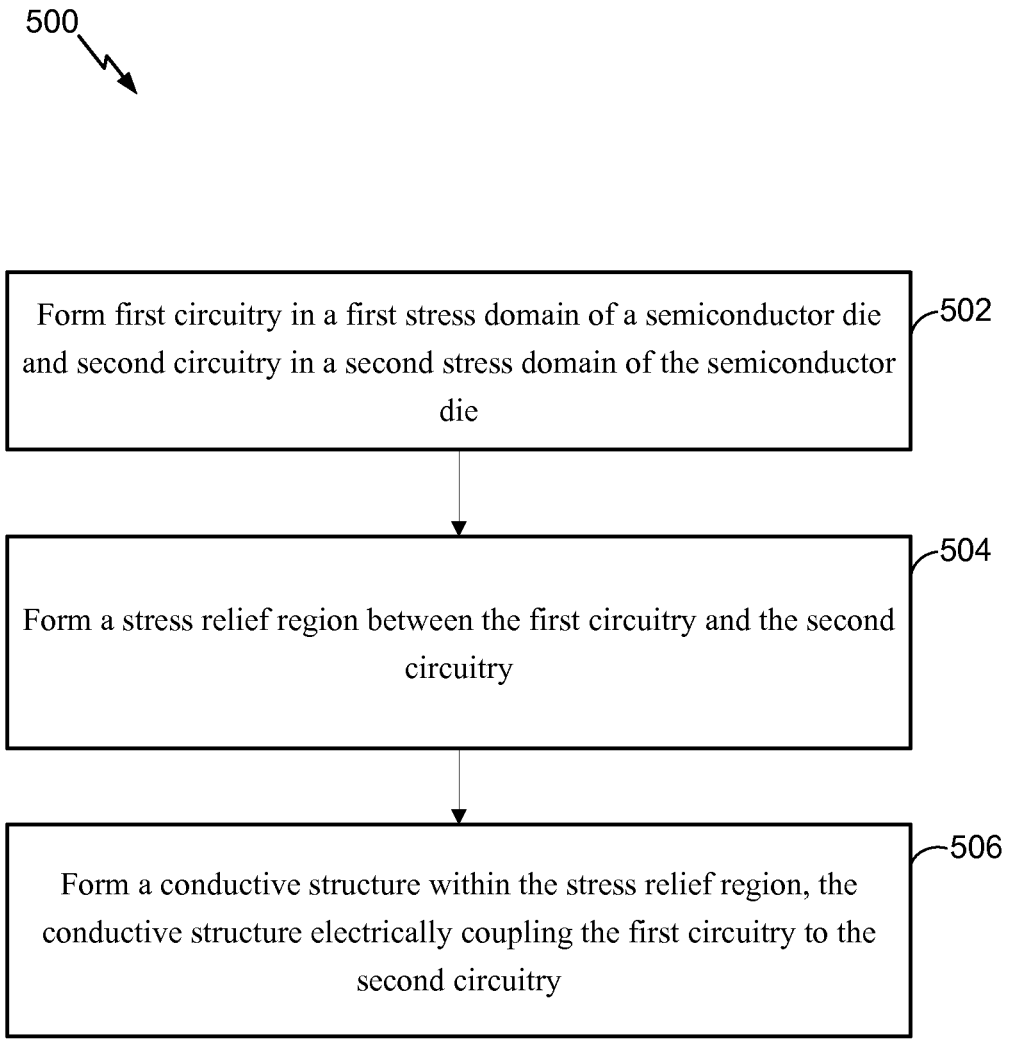
FIG. 5 is a flow chart of a particular embodiment of a method of forming a device that includes one or more stress relief regions to reduce stress.

Referring to FIG. 5, a flow chart of a first illustrative embodiment of a method of forming an electronic device that includes a stress relief region between a first stress domain and a second stress domain of a substrate (e.g., of a semiconductor die or other integrated circuit), where the stress relief region includes a conductive structure (e.g., an SMS) electrically coupling a first circuitry of the first stress domain to the second circuitry of the second stress domain, such as the electronic device 100 of FIG. 1, is shown. One or more operations of the method 500 may be initiated by a processor integrated into an electronic device, as described further with reference to FIG. 7.

The method 500 includes forming first circuitry associated with a first stress domain of the substrate (e.g., of the semiconductor die or other integrated circuit) and second circuitry associated with a second stress domain of the substrate (e.g., of the semiconductor die or other integrated circuit) at 502. The first circuitry may correspond to the first circuitry 114 of FIG. 1, and the second circuitry may correspond to the second circuitry 116 of FIG. 1. In a particular embodiment, the circuitries 114 and 116 may be disposed on the substrate. The substrate may correspond to the substrate 130 of FIG. 1. As described above, the first circuitry and the second circuitry include one or more dielectric layers and one or more metallization layers. The layers of the first circuitry and the second circuitry may be deposited using a film deposition process, such as a chemical vapor deposition (CVD) process, a spin-on process, a plasma-enhanced chemical vapor deposition (PECVD) process, a physical vapor deposition (PVD) process, or an atomic layer deposition (ALD) process, followed by a chemical-mechanical planarization (CMP) process.

The method 500 includes forming a stress relief region between the first circuitry and the second circuitry, at 504. The stress relief region may correspond to the stress relief region 112 of FIG. 1. The stress relief region may be formed by removing at least a portion of at least one dielectric layer in the first and second stress domains from between the first circuitry and the second circuitry. The dielectric layers may be removed using an etching process. The stress relief region may be formed by removing a portion of at least one dielectric layer from between the first stress domain and the second stress domain.

The method 500 includes forming a conductive structure within the stress relief region, at 506. The conductive structure may electrically couple the first circuitry to the second circuitry. As described above, the conductive structures include one or more metallization layers. The layers of the conductive structures may be deposited using a film deposition process, such as a chemical vapor deposition (CVD) process, a spin-on process, a plasma-enhanced chemical vapor deposition (PECVD) process, a physical vapor deposition (PVD) process, or an atomic layer deposition (ALD) process, followed by a chemical-mechanical planarization (CMP) process. In some embodiments, forming the conductive structure includes forming a stress mitigation structure by forming a bend between a first portion of the conductive structure and a second portion of the conductive structure.

Figure 6:
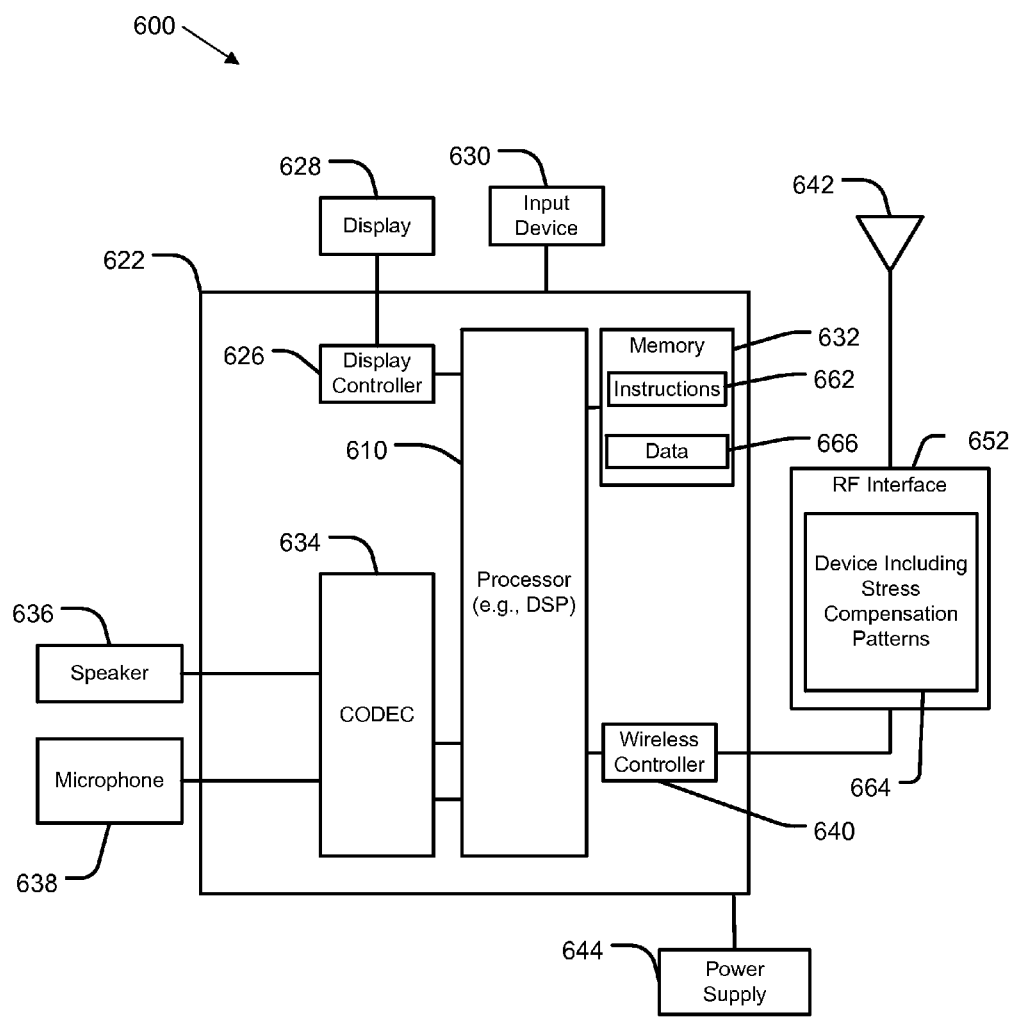
FIG. 6 is a block diagram of a particular illustrative embodiment of a wireless communication device that includes a device that includes one or more stress relief regions.

Referring to FIG. 6, a block diagram of a particular illustrative embodiment of a wireless communication device is depicted and generally designated 600. The wireless communication device 600 includes a processor 610, such as a digital signal processor (DSP), coupled to a memory 632 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art). The memory 632 may include a storage medium that stores instructions 662 executable by the processor 610. The memory 632 may store data 666 accessible to the processor 610.

The wireless communication device 600 includes a device 664 that includes intra-device (e.g., intra-die) stress relief regions. In an illustrative embodiment, the device 664 may correspond to the device 100 of FIG. 1. For example, as depicted in FIG. 6, a radio frequency (RF) interface 652 may include the device 664.

FIG. 6 also shows a display controller 626 that is coupled to a processor 610 and to a display 628. A coder/decoder (CODEC) 634 may also be coupled to the processor 610. A speaker 636 and a microphone 638 may be coupled to the CODEC 634. FIG. 6 also indicates that a wireless controller 640 may be coupled to the processor 610 and may be further coupled to an antenna 642 via the RF interface 652.

In a particular embodiment, the processor 610, the display controller 626, the memory 632, the CODEC 634, and the wireless controller 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 638, the RF interface 652, the wireless antenna 642, and the power supply 644 are external to the system-on-chip device 622. However, each of the display 628, the input device 630, the speaker 636, the microphone 638, the RF interface 652, the antenna 642, and the power supply 644 may be coupled to a component of the system-on-chip device 622, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include wafers that are then cut into die and packaged into a chip. The chips are then integrated into electronic devices, as described further with reference to FIG. 7.

Figure 7:
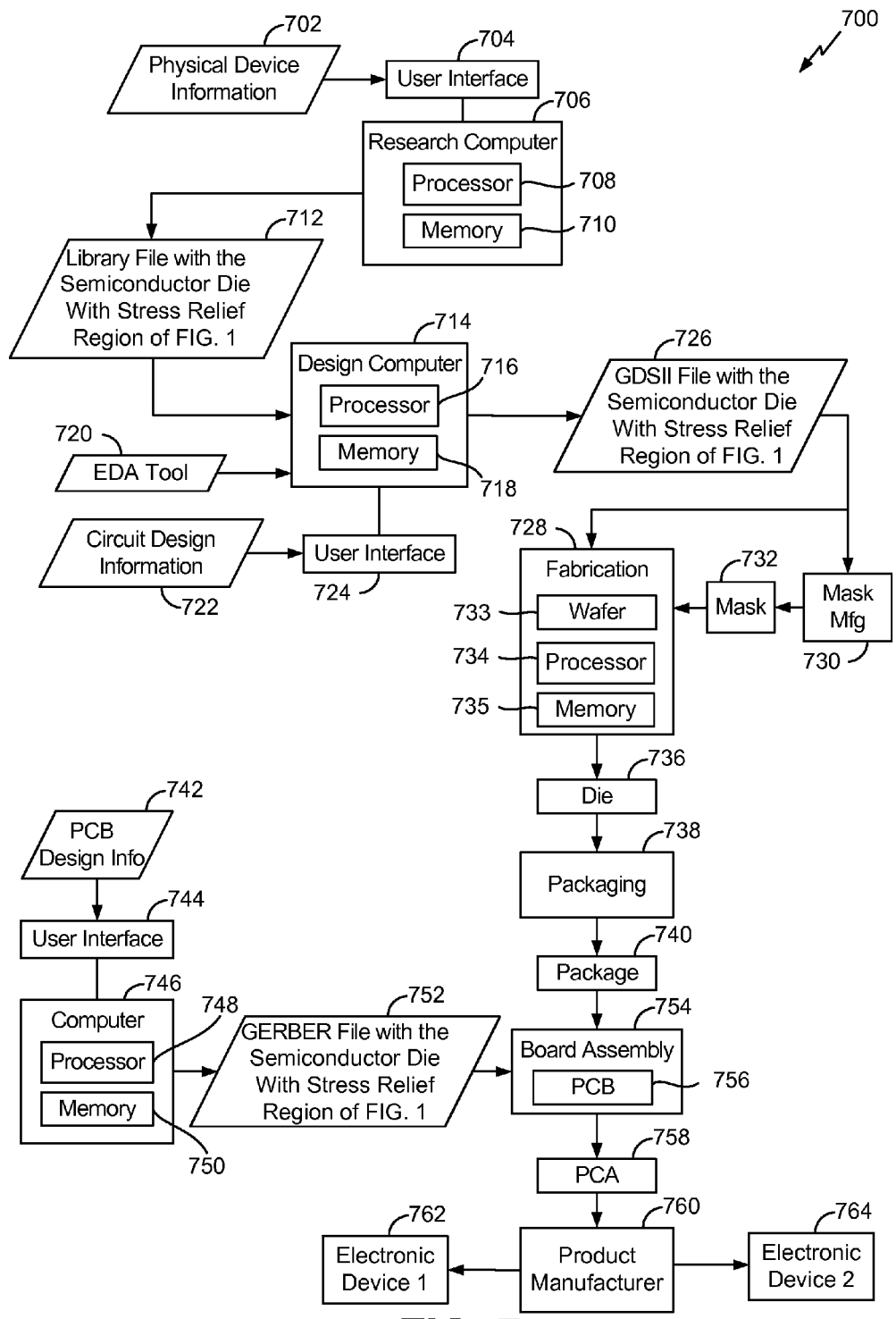
FIG. 7 is a data flow diagram of a particular illustrative embodiment of a manufacturing process to fabricate a device including one or more stress relief regions.

Referring to FIG. 7, a particular illustrative embodiment of an electronic device manufacturing (e.g., fabricating) process is depicted and generally designated 700. Physical device information 702 is received at the manufacturing process 700, such as at a research computer 706. The physical device information 702 may include design information representing at least one physical property of an electronic device that includes a stress relief region between a first stress domain and a second stress domain, where the stress relief region includes a conductive structure (e.g., an SMS) electrically coupling the first circuitry to the second circuitry, such as the electronic device 100 of FIG. 1. For example, the physical device information 702 may include physical parameters, material characteristics, and structure information that is entered via a user interface 704 coupled to the research computer 706. The research computer 706 includes a processor 708, such as one or more processing cores, coupled to a computer-readable medium (e.g., a non-transitory computer-readable medium), such as a memory 710. The memory 710 may store computer-readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including the device 100 of FIG. 1 that is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit including the electronic device 100 of FIG. 1 using the library file 712. For example, a user of the design computer 714 may enter circuit design information 722 via a user interface 712 coupled to the design computer 714. The circuit design information 722 may include design information representing at least one physical property of the electronic device that includes a stress relief region between a first stress domain and a second stress domain, where the stress relief region includes a conductive structure (e.g., an SMS) electrically coupling the first circuitry to the second circuitry, such as the device 100 of FIG. 1. To illustrate, the circuit design property may include identification of particular circuits and relationships to other elements in a circuit design, positioning information, feature size information, stress relief region information, SMS information, interconnection information, or other information representing a physical property of a semiconductor device.

The design computer 714 may be configured to transform the design information, including the circuit design information 722, to comply with a file format. To illustrate, the file format may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the electronic device that includes a stress relief region between a first stress domain and a second stress domain, where the stress relief region includes a conductive structure (e.g., an SMS) electrically coupling the first circuitry to the second circuitry, such as the electronic device 100 of FIG. 1, in addition to other circuits or information. To illustrate, the data file may include information corresponding to a system-on-chip (SOC) that includes the electronic device that includes a stress relief region between a first stress domain and a second stress domain, where the stress relief region includes a conductive structure (e.g., an SMS) electrically coupling the first circuitry to the second circuitry, such as the device 100 of FIG. 1, and that also includes additional electronic circuits and components within the SOC.

The GDSII file 726 may be received at a fabrication process 728 to fabricate an electronic device that includes a stress relief region between a first stress domain and a second stress domain, where the stress relief region includes a conductive structure electrically coupling the first circuitry to the second circuitry, such as the device 100 of FIG. 1, according to transformed information in the GDSII file 726. For example, a device manufacture process may include providing the GDSII file 726 to a mask manufacturer 730 to create one or more masks, such as masks to be used with photolithography processing, illustrated as a representative mask 732. The mask 732 may be used during the fabrication process to generate one or more wafers 733, which may be tested and separated into dies, such as a representative die 736. The die 736 includes a circuit including the electronic device that includes a stress relief region between a first stress domain and a second stress domain, where the stress relief region includes a conductive structure electrically coupling the first circuitry to the second circuitry, such as the device 100 of FIG. 1.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the device 100 of FIG. 1.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the device 100 of FIG. 1. In other embodiments, the data file generated by the transformed PCB design information may have a format other than a GERBER format.

The GERBER file 752 may be received at a board assembly process 729 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. For example, the first representative electronic device 762, the second representative electronic device 764, or both, may include or correspond to the wireless communication device 600 of FIG. 6. As an illustrative, non-limiting example, the first representative electronic device 762, the second representative electronic device 764, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 762, the second representative electronic device 764, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the device including a stress relief region between a first stress domain and a second stress domain, where the stress relief region includes a conductive structure electrically coupling the first circuitry to the second circuitry, such as the electronic device 100 of FIG. 1, is integrated. As another illustrative, non-limiting example, one or more of the electronic devices 762 and 764 may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 7 illustrates remote units according to teachings of the disclosure, the disclosure is not limited to these illustrated units. Embodiments of the disclosure may be suitably employed in any device which includes active integrated circuitry including memory and on-chip circuitry.

A device that includes a semiconductor device including the electronic device that includes a stress relief region between a first stress domain and a second stress domain, where the stress relief region includes a conductive structure electrically coupling the first circuitry to the second circuitry, such as the device 100 of FIG. 1, may be fabricated, processed, and incorporated into an electronic device, as described in the illustrative process 700. One or more aspects of the embodiments disclosed with respect to FIGS. 1-4 may be included at various processing stages, such as within the library file 712, the GDSII file 726 (e.g., a file having a GDSII format), and the GERBER file 728 (e.g., a file having a GERBER format), as well as stored at the memory 710 of the research computer 706, the memory 709 of the design computer 714, the memory 727 of the computer 746, the memory of one or more other computers or processors (not shown) used at the various stages, such as at the board assembly process 729, and also incorporated into one or more other physical embodiments such as the mask 732, the die 736, the package 722, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity or by one or more entities performing various stages of the process 700.

In conjunction with the described embodiments, a device is disclosed that includes first means for conducting associated with a first stress domain of a substrate (e.g., of a semiconductor die or other integrated circuit), second means for conducting within a second stress domain of the substrate, and means for relieving stress, where the means for relieving stress is positioned between the first means for conducting and the second means for conducting. The means for relieving stress may include a conductive structure electrically coupling the first means for conducting and the second means for conducting. The first means for conducting may correspond to the circuitry 114 of FIG. 1. The second means for conducting may correspond to the circuitry 116 of FIG. 1. The means for relieving stress may correspond to the one or more stress relief regions 112 of FIG. 1, 220 of FIG. 2, 320 of FIG. 3, and/or 420 of FIG. 4. The conductive structure electrically coupling the first means for conducting and the second means for conducting may correspond to any one or more of the SMS structures 122, 124, 126, and/or 128 of FIG. 1, 326 of FIG. 3, and/or 422 of FIG. 4.

Although one or more of FIGS. 1-7 may illustrate systems, devices, and/or methods according to the teachings of the disclosure, the disclosure is not limited to these illustrated systems, devices, and/or methods. Embodiments of the disclosure may be suitably employed in any device that includes integrated circuitry including memory, a processor, and on-chip circuitry.

Although one or more of FIGS. 1-7 may illustrate systems, devices, and/or methods according to the teachings of the disclosure, the disclosure is not limited to these illustrated systems, devices, and/or methods. One or more functions or components of any of FIGS. 1-7 as illustrated or described herein may be combined with one or more other portions of another of FIGS. 1-7. Accordingly, no single embodiment described herein should be construed as limiting and embodiments of the disclosure may be suitably combined without departing form the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:
   a substrate;
   first circuitry associated with a first stress domain of the substrate;
   second circuitry associated with a second stress domain of the substrate; and
   a stress relief region between the first stress domain and the second stress domain, the
   stress relief region comprising an electrically conductive structure in direct contact with at least a portion of the substrate, the conductive structure configured to electrically couple the first circuitry to the second circuitry.

2. The device of claim 1, wherein the stress relief region includes fewer layers than each of the first stress domain and the second stress domain to reduce inter-domain stress between the first stress domain and the second stress domain.

3. The device of claim 1, further comprising:
   a first portion of a dielectric layer positioned in the first stress domain; and
   a second portion of the dielectric layer positioned in the second stress domain,
   wherein the dielectric layer is not in the stress relief region.

4. The device of claim 3, wherein the dielectric layer is an interlayer dielectric layer in contact with one or more active layers of the device.

5. The device of claim 3, wherein the dielectric layer is less than or equal to 15 micrometers thick.

6. The device of claim 1, wherein the substrate comprises silicon or glass.

7. The device of claim 1, wherein the substrate is less than or equal to 700 micrometers thick.

8. The device of claim 1, wherein the substrate is less than or equal to 500 micrometers thick.

9. The device of claim 1, wherein the first circuitry comprises a first portion of a metallization layer, and wherein the second circuitry comprises a second portion of the metallization layer.

10. The device of claim 9, wherein the metallization layer is less than or equal to 50 micrometers thick.

11. The device of claim 1, further comprising:
    first portions of a plurality of dielectric layers positioned in the first stress domain; and
    second portions of the plurality of dielectric layers positioned in the second stress domain,
    wherein at least one of the plurality of dielectric layers is not in the stress relief region.

12. The device of claim 1, wherein the conductive structure comprises a stress mitigation structure that includes a bend between a first portion of the conductive structure and a second portion of the conductive structure.

13. The device of claim 1, further comprising a passivation layer over the first stress domain, the second stress domain, and the stress relief region.

14. The device of claim 1, wherein the conductive structure comprises aluminum, copper, or a combination thereof.

15. The device of claim 1, wherein the first circuitry and the second circuitry are included in an integrated passive device.

16. The device of claim 1, wherein the first circuitry and the second circuitry are included in at least a portion of a wafer level chip scale package (WLCSP).

17. The device of claim 1, further comprising:
    third circuitry associated with a third stress domain of the substrate; and
    fourth circuitry associated with a fourth stress domain of the substrate,
    wherein the stress relief region is between the first stress domain and the third stress domain, between the first stress domain and the fourth stress domain, between the second stress domain and the third stress domain, between the second stress domain and the fourth stress domain, and between the third stress domain and the fourth stress domain.

18. The device of claim 17, wherein the device includes a die including the substrate, and wherein each of the first stress domain, the second stress domain, the third stress domain, and the fourth stress domain is within the die.

19. The device of claim 1, further comprising at least one of a set-top box, a music player, a video player, an entertainment unit, a navigation device, a communications device, a personal digital assistant (PDA), a fixed location data unit, or a computer, into which the first circuitry, the second circuitry, and the stress relief region are integrated.

20. A method comprising:
forming first circuitry associated with a first stress domain of a substrate and second circuitry associated with a second stress domain of the substrate;
forming a stress relief region between the first circuitry and the second circuitry; and
forming an electrically conductive structure within the stress relief region and in direct contact with at least a portion of the substrate, the conductive structure configured to electrically couple the first circuitry to the second circuitry.

21. The method of claim 20, wherein forming the stress relief region comprises removing a portion of at least one dielectric layer from between the first stress domain and the second stress domain.

22. The method of claim 21, wherein the portion is removed using an etch process.

23. The method of claim 20, wherein forming the conductive structure comprises forming a stress mitigation structure by forming a bend between a first portion of the conductive structure and a second portion of the conductive structure.

24. A device comprising:
a substrate;
first means for conducting associated with a first stress domain of the substrate;
second means for conducting associated with a second stress domain of the substrate; and
means for relieving stress, the means for relieving stress positioned between the first means for conducting and the second means for conducting, the means for relieving stress comprising an electrically conductive structure in direct contact with at least a portion of the substrate, the conductive structure configured to electrically couple the first means for conducting and the second means for conducting.

25. The device of claim 24, further comprising:
a first portion of a dielectric layer positioned in the first stress domain; and
a second portion of the dielectric layer positioned in the second stress domain,
wherein the dielectric layer does not form part of the means for relieving stress.

26. The device of claim 24, wherein the conductive structure comprises a stress mitigation structure.

27. A method comprising:
receiving a data file comprising design information corresponding to a semiconductor device; and
fabricating the semiconductor device according to the design information, wherein the semiconductor device comprises:
a substrate;
first circuitry associated with a first stress domain of the substrate;
second circuitry associated with a second stress domain of the substrate; and
a stress relief region between the first stress domain and the second stress domain, the stress relief region comprising an electrically conductive structure in direct contact with at least a portion of the substrate, the conductive structure configured to electrically couple the first circuitry to the second circuitry.

28. The method of claim 27, wherein the conductive structure comprises a stress mitigation structure.

29. The device of claim 1, wherein the conductive structure is non-planar.

30. The device of claim 1, wherein the conductive structure includes:
a first conductive layer coupled to a first portion of a first metallization layer in the first stress domain and coupled to a second portion of the first metallization layer in the second stress domain; and
a second conductive layer coupled to a first portion of a second metallization layer in the first stress domain and coupled to a second portion of the second metallization layer in the second stress domain,
wherein the first conductive layer is in contact with the second conductive layer.

* * * * *